US005663075A

United States Patent [19]
Robinson

[11] Patent Number: 5,663,075
[45] Date of Patent: Sep. 2, 1997

[54] METHOD OF FABRICATING BACKSIDE ILLUMINATED FET OPTICAL RECEIVER WITH GALLIUM ARSENIDE SPECIES

[75] Inventor: Gerald D. Robinson, Santa Barbara, Calif.

[73] Assignee: The United States of America as represented by the Secretary of the Air Force, Washington, D.C.

[21] Appl. No.: 274,931

[22] Filed: Jul. 14, 1994

[51] Int. Cl.$^6$ .................. H01L 31/18; H01L 21/265; H01L 21/203; H01L 21/20
[52] U.S. Cl. .................. 438/92; 438/64; 438/571; 438/980; 438/977; 438/118; 438/94
[58] Field of Search .................. 437/912, 5, 107, 437/132, 133, 39; 257/189, 192, 280

[56] References Cited

U.S. PATENT DOCUMENTS

| | | | |
|---|---|---|---|
| 4,321,613 | 3/1982 | Hughes et al. | 437/133 |
| 5,008,213 | 4/1991 | Kolesar, Jr. | 437/51 |
| 5,180,681 | 1/1993 | Mishra et al. | 437/40 |
| 5,204,278 | 4/1993 | Imamura et al. | 437/40 |
| 5,356,823 | 10/1994 | Mitani | 437/912 |

Primary Examiner—Mary Wilczewski
Assistant Examiner—Brian K. Dutton
Attorney, Agent, or Firm—Gerald B. Hollins; Thomas L. Kundert

[57] ABSTRACT

A photo FET device having a large area backside optical energy reception surface is disclosed. The photo FET device is fabricated in the source gate and drain upward configuration and then inverted onto a new permanent substrate member and an original surrogate substrate member removed in order to expose the active area backside optical energy reception surface. Electrical characteristics including curve tracer electrical data originating in both dark and illuminated devices and devices of varying size and both depletion mode and enhancement mode operation are also disclosed. Fabrication of the device from gallium arsenide semiconductor material and utilization for infrared energy transducing in a number of differing electronic applications are also disclosed.

20 Claims, 3 Drawing Sheets

METHOD OF FABRICATING BACKSIDE ILLUMINATED FET OPTICAL RECEIVER WITH GALLIUM ARSENIDE SPECIES

RIGHTS OF THE GOVERNMENT

The invention described herein may be manufactured and used by or for the Government of the United States for all governmental purposes without the payment of any royalty.

CROSS REFERENCE TO RELATED APPLICATIONS

The present document is somewhat related to the copending and commonly assigned applications "FET Optical Receiver Using Backside Illumination, Indium Phosphide Species Method", Ser. No. 08/274,930; "Wafer Joined Opto-Electronic Integrated Circuits Method", Ser. No. 08/274,882, now U.S. Pat. No. 5,472,914; and "Backside Illuminated MSM Device Method", Ser. No. 08/274,889; which are filed of even date herewith in the names of different inventors. The contents of these related applications are hereby incorporated by reference herein.

BACKGROUND OF THE INVENTION

This invention relates to the field of optical to electrical signal transducer devices and their fabrication in the form of a field effect transistor (FET).

In providing semiconductor devices for transducing optical energy signals into electrical energy signals, it has become generally accepted that the field effect transistor provides something less than an optimum arrangement starting point for achieving the desired optical-to-electrical signal conversion or signal transducing. Although a number of effects contribute to this less than optimum starting point status, one especially significant consideration relates to the presence of optical energy-obscuring structure, including source, drain and gate-related metallic conductor members, dispersed over the same transistor surface used to receive an optical energy signal in the typical FET arrangement. In many FET arrangements these conductors, which communicate with the source drain and gate elements of the transistor, occupy such a major portion of the transistor's surface area as to relegate the remaining area usable for optical energy reception to less than 50% of the overall surface of the transistor.

In addition to this obscured surface area difficulty, when a GaAs FET structure is epitaxially grown onto a single crystal GaAs host substrate an interface is formed which creates a partial depletion of carriers at the interface. When the FET is fabricated this 'built-in' depletion layer may act in opposition to the desired depletion region created by the Shottky barrier gate. This is not a severe problem for most typical applications of FETs, where the FETs are used for electrical amplification and modulation. If the FET is to be used as a photodetector, however, the "built-in" depletion region will undesirably limit the gain and modulation characteristics of the device. In addition, if the FET is inverted and the GaAs substrate removed, an air to active layer interface is created which also has a 'built-in' depletion layer. This layer may actually enhance the achieved photoconductance since photons can be injected into the active layer.

Notwithstanding these phenomenon, there are a number of advantages in achieving an efficient photo transducing field effect transistor (i.e., a photo FET or OPFET). The availability of electrical signal amplification within the transducer device itself is, of course, one of the inherent advantages of a practical photo FET. The overall simplicity of a photo FET device and the possible fabrication material compatibility with integrated circuit devices are additional advantages to be achieved from an acceptable photo FET arrangement. In addition, the ability to perform processing on both sides of a photo FET the device provides an opportunity to create structures which have heretofore been impossible, for example, opposed-gate FETs and counter-electrode configurations, to tailor depletion regions and create ballistic (super fast) devices. Anti-reflection coatings, such as, silicon nitride, $Si_3N_4$; silicon oxides $SiO$, $SiO_2$; and wavelength filtering dielectrics can easily be applied to the exposed active layer using conventional evaporation or sputtering equipment. Moreover, passive and/or active devices, e.g., vertical cavity lasers (VCLs), can be bonded to the backside of such an OPFET to create an optical transceiver assembly.

The U.S. patent art indicates the presence of considerable inventive activity, especially with respect to the MESFET (metal semiconductor field effect transistor) device and its use as an electrical circuit element. Prior patent activity however appears limited in the area of photo optical transducing MESFET devices as is disclosed herein.

Previous MESFET related patents include the patent of U. K. Mishra et al., U.S. Pat. No. 5,180,681, which is concerned with the fabrication of a high current high voltage breakdown field effect transistor of the MESFET type, including the fabrication of such devices with gallium arsenide material. In addition the invention of S. Inmamura et al., in U.S. Pat. No. 5,204,278, discloses the use of Group III–V periodic table semiconductor compounds such as gallium arsenide and the configuration of a MESFET device to include a Shottky gate electrode arrangement. In addition, the invention of E. Kolesar Jr. in U.S. Pat. No. 4,989,063 is of general background interest with respect to the present invention in the sense that it discloses use of an epoxy adhesive during a semiconductor device fabrication sequence.

Neither the application of the MESFET configuration to optical transducing service nor the improved configuration of a MESFET device for this usage is known to have been accomplished however.

SUMMARY OF THE INVENTION

The present invention provides a photo FET device, particularly a device of the MESFET type, that overcomes at least one important disadvantage of previous photo devices by providing unobstructed access to the device's active region by incident optical energy. The device of the invention also provides desirable high frequency characteristics and desirable optical spectrum response. These advantages and improved optical efficiency are achieved in the device of the invention through among other things, "backside" illumination of the device's charge carrier transport region—i.e., by burying the necessary source gate and drain electrodes and their accompanying metalizations on the substrate side of the FET structure thereby maintaining the backside surface unencumbered for optical energy reception. The achievement of this transistor configuration is enabled by use of a substrate removal sequence during fabrication of the photo FET. The substrate removal is achieved in either of two disclosed manners during this sequence. The invention also includes a particular semiconductor material species embodiment of the FET device and its fabrication.

It is an object of the present invention therefore, to provide an optically efficient photo FET device.

It is another object of the invention to provide a photo FET device in which substantially one hundred percent of the device's charge transport region surface area is made available for optical energy impingement.

It is another object of the invention to provide a high-speed photo FET device.

It is another object of the invention to provide a photo FET device which can be fabricated with gallium arsenide-inclusive semiconductor materials.

It is another object of the invention to provide an optical to electrical transducer device that provides electrical signal gain properties in addition to optical signal to electrical signal transducing capability.

It is another object of the invention to provide a photo FET device which may be fabricated in a plurality of different physical size and physical arrangement configurations.

It is another object of the invention to provide a practical method of fabricating an upside-down photo field effect transistor device.

It is another object of the invention to provide an inverted photo FET transistor which can be achieved through the use of substrate removal and replacement fabrication techniques.

It is another object of the invention to provide a photo FET device having a particularly useful and possibly double ranged optical spectrum response characteristic.

Additional objects and features of the invention will be understood from the following description and claims and the accompanying drawings.

These and other objects of the invention are achieved by an optical signal to electrical signal transducing field effect transistor apparatus comprising the combination of:

a supporting substrate number;

a field effect transistor source member received on said substrate member and extending over an upper surface portion thereof toward a central gate region location of said transistor;

a field effect transistor drain member received on said substrate member and extending over an upper surface portion thereof toward said central gate region location and said source member;

field effect transistor gate means received in said substrate member and extending between said source member and said drain member in said central gate region over an upper surface portion of said supporting substrate member;

an optical energy responsive layer of semiconductor material overlaying said source member, said drain member, and said gate means;

said layer of semiconductor material comprising an active region of said transistor and including a buried frontside portion located adjacent said source and drain members and said gate means, an exposed and optical energy receptive backside portion located opposite said frontside portion and said substrate member and a source member to drain member-connecting optical energy controllable charge carrier region located intermediate said layer of semiconductor material frontside and backside portions; and electrical contact conductor means disposed below said source member, said drain member and said gate means and extending upward adjacent said active region from said buried frontside portion of said semiconductor layer active region to said exposed backside portion for electrically connecting said source member, said drain member and said gate means of said transistor to external electrical circuitry.

DETAILED DESCRIPTION

Figure 1A:
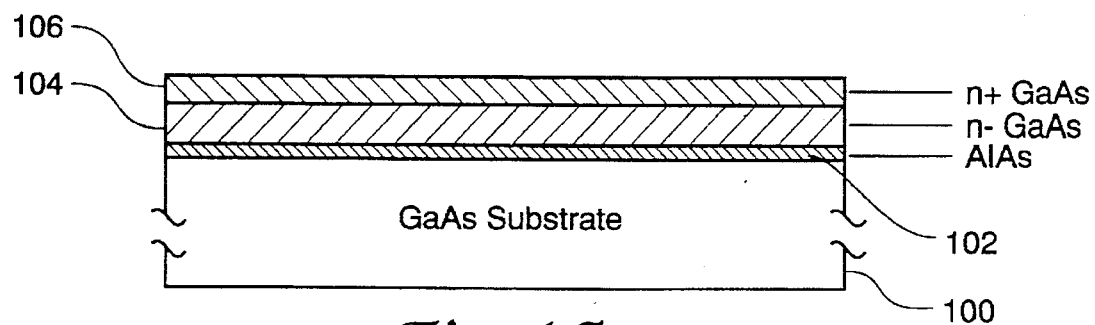
FIG. 1A shows the first step in a sequence for fabricating a photo FET in accordance with the invention.

FIG. 1A through FIG. 1D in the drawings shows a condensed four-step sequence for fabricating photo FET devices of the MESFET type in accordance with the present invention. The four steps of the FIG. 1 process are described in the views of FIGS. 1A, 1B, 1C and 1D, where the results of individual acts in the fabrication sequence are shown in graphic representation. In the FIG. 1A through FIG. 1D views as well as in the views of other figures in the present description, the original number identification of a represented element is maintained in successive veiws, even though newly appearing elements are provided with numbers having a hundreds digit corresponding to the drawing figure number.

FIG. 1A in the drawings shows the results of a first series of acts in the device fabrication sequence. In the FIG. 1A drawing, a single crystal surrogate or temporary substrate member 100 which may be composed of semi-insulating gallium arsenide is provided with a thin stop etch layer 102 which may be composed of such material as alumina arsenide. Overlaying the layer 102 is a thicker layer 104 which may be composed of material such as n− type gallium arsenide as. The layer 104 is in turn covered by a layer of n+ gallium arsenide indicated at 106. The gallium arsenide material of the n− layer 104 is preferably doped with silicon to a doping concentration of $2\text{--}4\times10^{17}$ ions/cm$^3$. In a similar manner the gallium arsenide in the n+ layer 106 is preferably doped with silicon to a doping concentration of $2\text{--}3\times10^{18}$ ions/cm$^3$. The aluminum arsenide layer 102 preferably includes an aluminum concentration of 50%. Aluminum arsenide material is particularly desirable for use in the layer 102 of the present device because of its susceptibility to hydrofluoric acid etching and is relatively inert response to etches which attack the gallium arsenide of the surrogate or temporary substrate member 100. These characteristics are relied upon in the subsequent processing of the FIG. 1A structure.

Each of the FIG. 1A through FIG. 1D layers, 102, 104, and 106 may be formed by the use of conventional techniques such as molecular beam epitaxy (MBE), Metal Organic Chemical Vapor Deposition (MOCVD), ion implantation, or other techniques as are known in the semiconductor art. Already fabricated wafers having layers in the nature of the layers 102, 104, and 106 are often available from semiconductor manufacturers and provide a convenient starting point for the FIG. 1A through FIG. 1D fabrication.

FIG. 1A through FIG. 1D in the drawings therefore shows the appearance of the FIG. 1 wafer following the performance of several layer forming conventional transistor fabrication steps—steps performed in order to ultimately achieve an inverted MESFET device. Persons skilled in the transistor fabrication art will appreciate that the thickness of the contacting layers 102, 104 and 106 in FIG. 1A may be varied over a considerable range according to the transistor characteristics and material properties involved. For present purposes however, layer thicknesses of 500 Angstroms (Å), 1500 Å, and 500 Å respectively for the layers 102, 104, and 106 are typical.

Figure 1B:
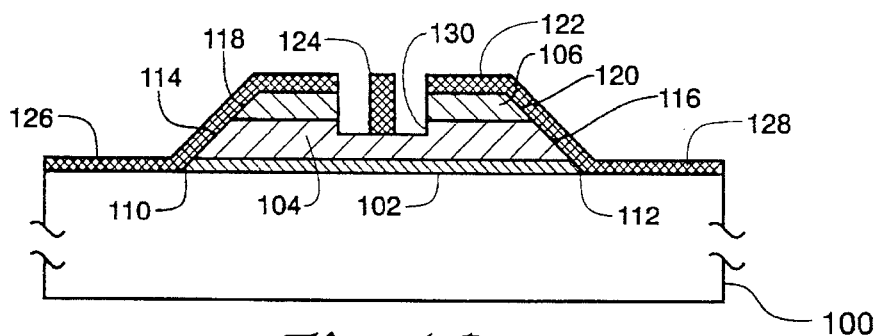
FIG. 1B shows a second step in fabricating a photo FET according to the invention.

In the FIG. 1B drawing, the n− type gallium arsenide layer 104 has been laterally terminated at the sloping lines 114 and 116, the n+ layer at 106 has been terminated at 118 and 120 and the aluminum arsenide layer 102 terminated at 110 and 112. In the FIG. 1B structure, a fourth layer 122 preferably of a metal such as nickel gold germanium (NiAuGe) has been formed as an alloyed ohmic contact over the top of the n+ gallium arsenide layer 106 and this fourth metal layer extended over the sloping termination regions 110, 114, 118, 112, 116, and 120 onto the exposed surfaces of the substrate 100 in the contact or pad regions 126 and 128. The metallic film of the layer 122 may have a thickness in the range of 1000 Å–2000 Å; and this layer may be accomplished by E beam evaporation and subsequent alloying at about 450° C.

In the recessed area 130, one of a variety of possible metals, such as titanium gold (TiAu), titanium platinum gold (TiPtAu), Aluminum (Al) etc. extends down to the recessed surface of the n− layer 104 to form a Shottky gate structure 124. The depth of the recess at 130 is of course determinative of the resulting transistor device's electrical properties including its characterization as a depletion mode or enhancement mode device. Excepting for the stop etch layer 102, the FIG. 1B illustrated transistor structure is therefore in resemblance of a conventional MESFET device—as may be employed for electrical switching and electrical signal amplification purposes.

Figure 1C:
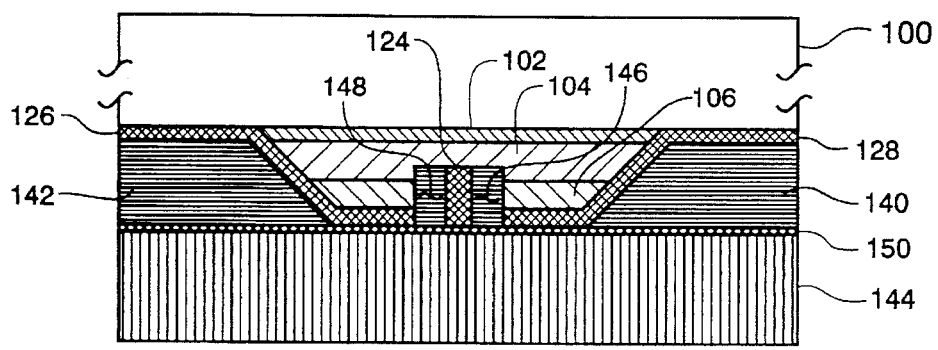
FIG. 1C shows a third step in the fabrication of a photo FET according to the invention.

FIG. 1C in the drawings shows a third step in the condensed fabrication sequence for a photo FET device according to the present invention. In the FIG. 1C drawing, the substrate 100 and the transistor formed thereon in the steps of FIG. 1A and FIG. 1B is shown to be in an inverted or topside down position and is attached to a second and permanent substrate member 144. Attachment of the transistor and substrate assembly from the FIG. 1B drawing to the substrate 144 is accomplished by way of a layer 150 of material such as a heat conducting epoxy adhesive, an adhesive such as the type H74 which is made by Epoxy Technology Company located in Billerica, Mass. for example. The substrate 144 may be fabricated of alumina, beryllium oxide, aluminum nitride, glass, gallium arsenide, or other semiconductor materials or from a variety of other materials. In addition to an epoxy adhesive bond to the substrate 144, a plasma chemical vapor deposition, PCVD, aluminum nitride or diamond material layer may also be used to achieve the second substrate member 144 attachment in FIG. 1C.

In addition to this physical inversion and new substrate attachment of the FIG. 1B transistor in the view of FIG. 1C, there is also shown in FIG. 1C a filling of the unoccupied spaces adjoining the transistor elements. These filled areas are indicated at 140, 142, 146 and 148 in the FIG. 1C. drawing. Preferably, this filling is accomplished by application of epoxy to the FIG. 1B structure prior to the FIG. 1C bonding to the substrate 144, an application using a vacuum compression and heating process as is well known in the semiconductor device fabrication art.

The second and permanent substrate member 144 in FIG. 1C may have any desired thickness however for most uses, a thickness in the range of 0.01 inch to 0.025 inch is desirable. With the addition of this second permanent substrate member, the GaAs surrogate substrate member 100 is subjected to a lap and polish operation in order to achieve a thickness of 50 to 60 microns. Following this lap and polish operation on the surrogate GaAs substrate 100, the remainder of this substrate is removed using a selective chemical and/or a reactive ion etching procedure as are known in the semiconductor art. This selective etching will react with the remainder portions of the gallium arsenide surrogate substrate member 100, but not with the aluminum arsenide of the stop etch layer 102. The aluminum arsenide material of the stop etch layer 102 is removed using a dilute hydrofluoric acid etch.

Removal of the stop etch layer 102 has of course achieved the desired exposure of the backside portion of the active region of the FIG. 1A through FIG. 1D photo FET device. Upon completion of the removal of the stop etch layer 102 therefore, the thus-far fabricated photo FET can be electrically and functionally tested prior to further fabrication steps by setting probes on the exposed metal contact regions at 126 and 128. These regions are in fact the contact regions for the source and drain elements of the FIG. 1 photo FET. Similar testing contact may be made with the metal of the Schottky gate member 124 in the portions thereof extending out from under the layer 104 at locations below the page or on top of the page of the FIG. 1C drawing, portions of the gate 124 which are visible in FIG. 3B of the drawings herein. Optical to electrical signal transducing function testing of the FIG. 1C structure can of course be accomplished by providing both an optical signal and electrical energization during this probe operation of the FIG. 1C device.

Figure 1D:
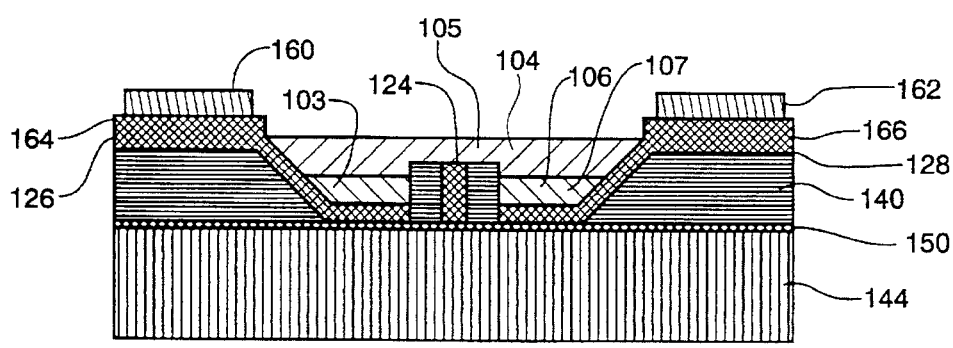
FIG. 1D shows a fourth step in the fabrication of a photo FET in accordance with the present invention.

FIG. 1D in the drawings shows the addition of bonding metallization in the form of adding additional thickness to the contact regions at 126 and 128. This additional thickness is shown at 164 and 166 in FIG. 1D; FIG. 1D also shows addition of the bonding connection pads at 160 and 162. The added metallization at 164 and 166 in FIG. 1D, in comparison with the metallization at 126 and 128 in FIG. 1C, allows easier wire bonding to the hard eutectic material of the contact regions at 126 and 128 and may be comprised of titanium gold (TiAu) or titanium platinum gold (TiPtAu) added to the ohmic contact pads at 126 and 128.

An alternate arrangement of the FIG. 1D device may be used in order to avoid the temperature limitations inherent in a gold-based ohmic contact—that is, to avoid the operating sequence wherein gold tends to migrate into the active region of the device at operating temperatures just above 125° C. In this alternate arrangement refractory ohmic contacts may be employed. Such contacts may be fabricated of germanium molybdenum tugnsten (GeMoW), for example, as has been disclosed in the French work of Chevalier and by others such as Merikami at Bellcor, for example. With such refractory metal contacts at 126, 128 and also at the gate 124, MESFET operation up to the temperature range of substrate electrical conductivity are possible. With substrate removal, as in the present invention, even higher operating temperatures are possible. (The companion patent document of H. Lee et al., Ser. No. 08/254,722, U.S. Pat. No. 5,416,902 is of some interest in this regard and is hereby incorporated by reference herein.)

It is interesting to note that a substrate removal arrangement therefore leads to both higher temperature operating capability in MESFET devices and also enables the benefits of the present backside illumination of a MESFET photodevice. Viewed from another perspective, the present invention device with its absence of a temperature limiting substrate and when provided with refractory metal contacts, provides desirable high temperature operating capability that extends well beyond the 125° C. range and possibly to the 400° C. range.

In the photo FET device of FIG. 1D, the region 103 functions as the transistor source, the region 105 as the transistor channel region and the region 107 as the transistor drain. As with many FET devices, however, source and drain regions may be interchanged in an electrical circuit use of the device.

Other variations of the FIG. 1 disclosed photo FET fabrication are of course possible. In particular it is possible to employ thin film peeling techniques wherein an etching away of the stop etch layer 102 is accomplished in order to release the uppermost layers of the transistor device in FIG. 1B from the substrate 100 for remounting. When such thin film peeling fabrication is employed, it may be desirable to remove the initial substrate 100 either before or after attachment to the permanent second substrate 144, depending on the overall fabrication techniques employed. Since the handling of peeled thin film transistor devices is a matter of considerable art, the herein-described inverted substrate removal-related fabrication process is believed preferable.

Figure 2A:
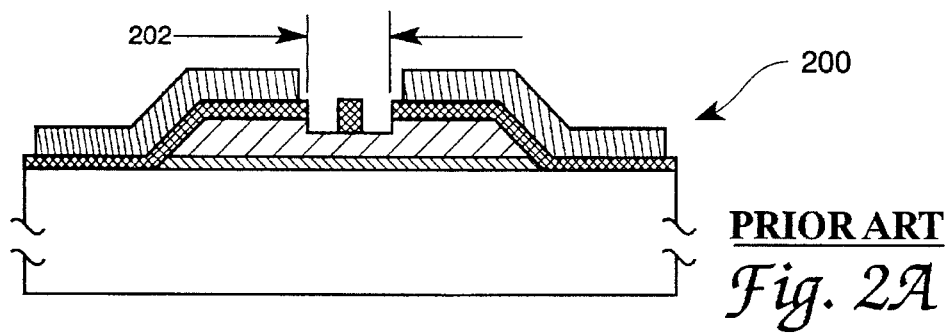
FIG. 2A shows the illumination area and other details of a conventional photo MESFET device.
Figure 2B:
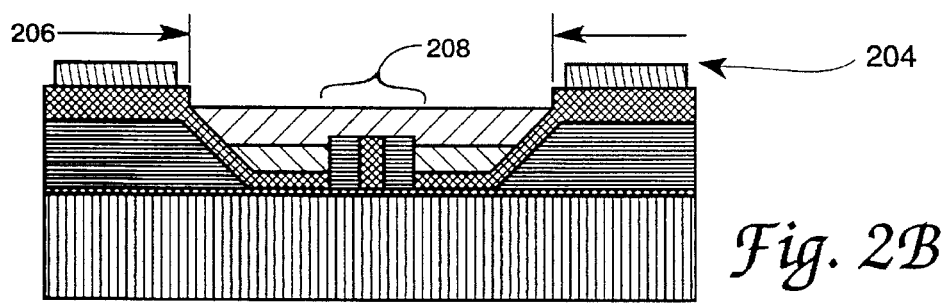
FIG. 2B shows a photo MESFET according to the present invention in comparison with the FIG. 2A device.

FIG. 2A and FIG. 2B in the drawing shows a comparison of the photo FET device of FIG. 1D in the FIG. 1A through FIG. 1D fabrication sequence with a conventional MESFET device. FIG. 2A and FIG. 2B employs vertically aligned views with the FIG. 2A and 2B drawings, views which allow graphic comprehension of the changes accomplished in devices made in accordance with the present invention. FIG. 2A therefore, shows at 200 a conventional MESFET device, a device having a possible optical energy receiving active region of the dimension indicated at 202. In contrast with this FIG. 2A conventional MESFET device, a MESFET device made according to the present invention is shown at 204 in FIG. 2B of the FIG. 2 drawings. In the device 204, the optical energy receiving active region is indicated at 206. Clearly the greater extent of this optical energy receiving active region in the photo FET of FIG. 2B is desirable for better utilization of an incident optical energy signal than is the source and drain metalization-obscured active region at 202 in the conventional MESFET device 200. The wide angle and unobscured optical access to the gate-attending region indicated at 208 for the FIG. 2B MESFET device is particularly desirable since this region proximate the Schottky gate structure is particularly effective for optical energy transducing purposes.

Figure 3A:
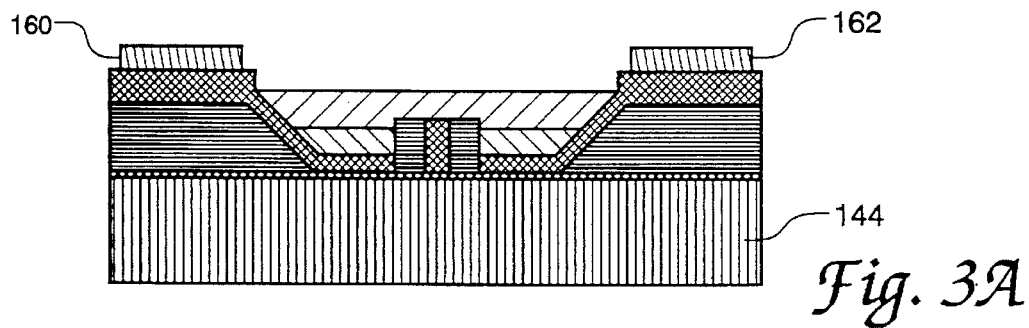
FIG. 3A shows a profile view of a MESFET device according to the present invention.
Figure 3B:
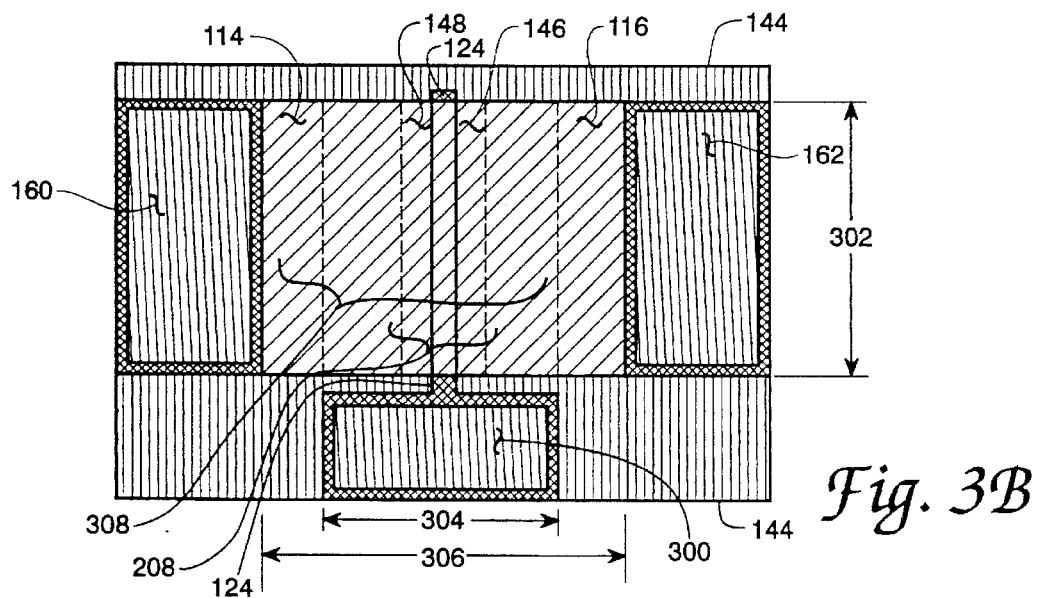
FIG. 3B shows a plan view of the FIG. 3A device.

FIG. 3A and FIG. 3B in the drawings show, elevation and plan representations of the present invention photo FET device as fabricated according to the FIG. 1A through FIG. 1D sequence. In the FIG. 3A and FIG. 3B views, lines indicating the Schottky gate element 124 for example, are vertically aligned, as are lines representing other portions of the photo FET device. The element numbers used in the FIG. 1A through FIG. 1D sequence are repeated in the FIG. 3A and FIG. 3B drawings and elements newly appearing in FIG. 3A and FIG. 3B are provided with numbers in the 300 series. The newly appearing elements in FIG. 3B include the bonding connection pad 300 for the Schottky gate member 124 and a lengthwise extent view of the bonding connection pad 162. The pads at 300 and 162 have dimensions 304 and 302 which are in the order of 200 μm×100 μm for a two hundred micron device embodiment of the invention, for example. The optical energy receiving or source to drain charge carrier flow region 308 in FIG. 3B may have a length 306 of 300–400 μm for the 200 micron sized device referred to above.

Figures 4A, 4B:
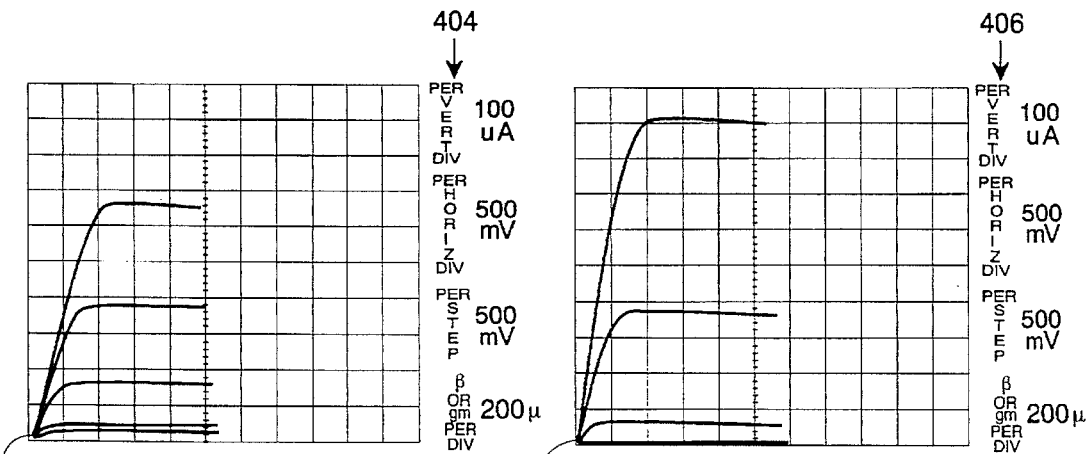
FIG. 4A shows the current vs. voltage characteristics for a MESFET according to the invention under dark conditions.
FIG. 4B shows the MESFET characteristics of FIG. 4A as altered by the presence of illuminating optical energy.

A principal electrical characteristic of interest with respect to the photo FET devices shown in FIG. 1A through FIG. 3B is of course the response of the transistor's $I_{ds}$ current to the incidence optical energy. Several aspects of this optical energy response are indicated in FIG. 4A through FIG. 6 of the drawings herein. In the drawings of this group, for example, FIG. 4A shows at 400 the current versus voltage characteristics of a typical 200 micron MESFET according to the invention before the surrogate substrate 100 is removed (i.e., the dark characteristics of a typical 200 micron device). The FIG. 4A drawing originates with a display of device characteristics on a curve tracing instrument, an instrument such as is manufactured by Techtronics Inc. of Beaverton, Oreg. The vertical and horizontal sensitivities of the curve tracer for the FIG. 4A display as well as the gate voltage increase for each of the constant current curves above the first curve in FIG. 4A and the transconductance ($g_m$) increment for each of the uppermost four curves in the FIG. 4A drawing are indicated in the vertical array of information at 404 in FIG. 4A. As indicated in this vertical array, each vertically disposed increment of the background grid in FIG. 4A represents a current change of 100 microamps, each horizontal increment a change of 500 millivolts, each successive curve a gate voltage increase of 500 millivolts and each successive curve a transconductance change of 200 micromhos.

Since the array numbers at 406 in the FIG. 4B drawing are identical to those at 404 FIG. 4A, the curve families 400 and 402 in these drawings, i.e., the dark and illuminated characteristics of a photo FET according to the invention, are directly comparable. These families illustrate the response of a photo FET according to the invention, a device of 200 micron nominal size, i.e., 200 microns by 50 microns active area with a 1 micron by 200 micron gate area, to an incident illumination in the range of 0.1–0.2 mW/cm² at 0.8–1.0 nanometer wavelength. This response may be appreciated, for example, by comparing the FIGS. 4A and 4B drawings and realizing that the FIG. 4B top curve represents a current of about one and one-half times that shown in FIG. 4A. This current increase is in response to the incident "backside" surface illumination in the FIG. 4B curves 402.

Figure 5:
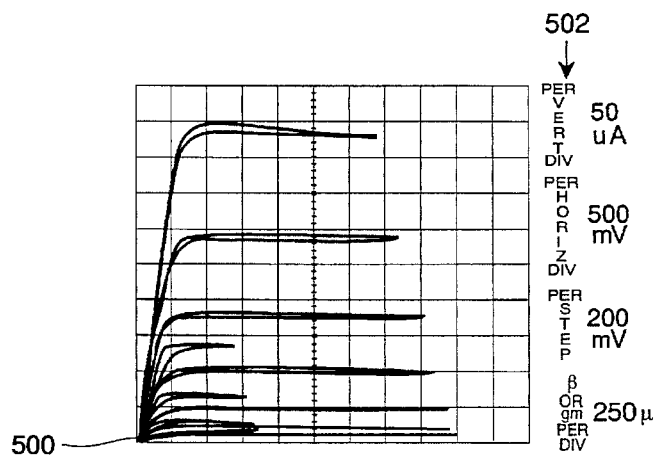
FIG. 5 shows the current vs. voltage characteristics for a smaller MESFET device having no substrate and both low level and higher level illumination.

FIG. 5 in the drawings shows two curves of the FIGS. 4A and 4B type in superimposed relationship for the case of a smaller 10 micron size MESFET device fabricated according to the invention. In the FIG. 5 drawing an optical illumination of 1.0–2.0 mW/cm² at 0.9 nm wavelength is used in obtaining the higher current values. The two families of curves represented at 500 in FIG. 5 are obtained with differing curve tracer settings from FIG. 4A and FIG. 4B as may be noted at 502 in the FIG. 5 drawing.

Figures 6A, 6B:
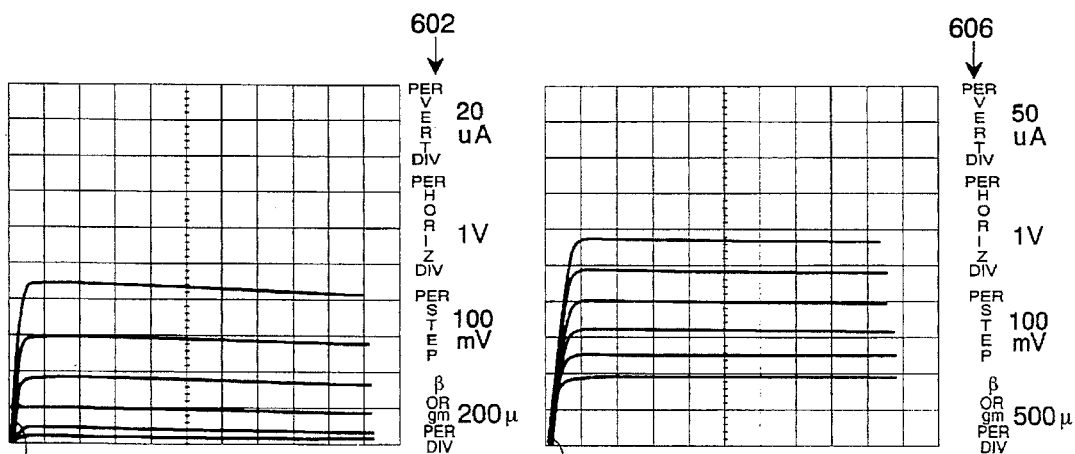
FIG. 6A shows the depletion mode characteristics of a small MESFET device according to the invention.
FIG. 6B shows the current vs. voltage characteristics for a small MESFET device according to the invention while operating in the enhancement mode.

FIG. 6A and FIG. 6B show a comparison between the depletion mode and enhancement mode performance of a ten micron MESFET device fabricated in accordance with the present invention. As in the case of FIG. 5, the curve tracer settings for the families of curves indicated at 600 and 604 in FIG. 6A and FIG. 6B are different, the appropriate settings being indicated at 602 and 606 in FIGS. 6A and 6B, respectively.

The photo FET of the present invention therefore provides a desirable large area active region surface for the reception of incident optical energy while maintaining the desired closer spacing of the source and drain electrodes of the transistor. The disclosed photo FET thereby avoids the performance degradation that has attended previous attempts to increase the size of an optical energy reception area in a photo FET device. The photo FET of the present invention is also improved over previous such devices in that the permanent substrate i.e. the substrate 144 in FIGS. 1C and 1D is separated from the semiconductor material 104 of the charge transport region of the transistor by the transistor's source and drain elements. As result of this separation, undesirable surface effects and contamination of the transistor's active area by substrate originating contamination is precluded.

As may also be appreciated by persons skilled in the transistor electrical circuit design art, the combination of an optical-to-electrical transducer with a transistor having electrical amplification, as may be achieved in the devices of the present invention, offers significant advantages. This combination, for example, provides an opportunity for both reduced active device count in a circuit arrangement and also offers opportunities for reducing the presence of white noise and other thermal effects in the output signal. Such thermal effects are commonly encountered in both optical-to-electrical transducers and in the low signal level first amplifying stage that follows other types of optical-to-electrical transducer devices in a particular circuit application.

The photo FET of the present invention is believed to offer performance advantages several different types of electronic device applications. Such devices as laser receivers as used in traffic law enforcement for example, automobile collision avoidance systems, infrared or optical spectrum camera equipment, fiber optic data transmission receivers and additional military hardware are believed to be ready applications of transistors fabricated according to the invention.

As disclosed herein, the photo FET of the invention is described in a generic sense with respect to its structure and its fabrication. This description also includes a gallium arsenide species of the described structure and fabrication. A somewhat related device which includes structure and fabrication involving an indium phosphide semiconductor material is described in the above-identified commonly owned and copending companion patent application.

Transistor devices fabricated with the gallium arsenide material disclosed herein display a peak response sensitivity in the 0.9 micrometer infrared wavelength range—as might be expected from the characteristics of a gallium arsenide based device. Such response peak is of course desirable for certain applications where infrared optical energy is to be detected. It is particularly interesting that frequency responses exceeding the two gigahertz range have also been noted for devices fabricated according to the invention. With optimization it is believed that frequency responses into an even higher range are achievable since GaAs MESFETs are inherently fast devices. Speeds approaching 8–10 Ghz have been observed, when devices are packaged in an appropriate high speed (RF) package.

An anti-reflective passivation coating can be expected to enhance the performance of the described device since it adds protection and eliminates spurious signals entering the active region.

While the apparatus and method herein described constitute a preferred embodiment of the invention, it is to be understood that the invention is not limited to this precise form of apparatus or method and that changes may be made therein without departing from the scope of the invention which is defined in the appended claims.

I claim:

1. A method of fabricating a light sensitive photo field effect transistor comprising the steps of:

growing a plurality of layers on a surrogate first substrate member;

forming a mesa on said surrogate first substrate member, wherein said mesa includes said plurality of layers;

depositing ohmic contact metal on said mesa and on a portion of said surrogate first substrate member adjacent said mesa;

forming a recessed area in said mesa to define a source, a drain, and a transistor active region;

forming a Shottky barrier gate electrode within said recessed area between said source and said drain;

forming a filler layer over said surrogate first substrate member adjacent said mesa, over the sidewalls of said mesa, and within said recessed area;

forming an adhesive layer on said filler layer and on said ohmic contact metal located on the crown of said mesa;

attaching a permanent second substrate member to said adhesive layer, said filler layer and said ohmic contact metal located on said crown of said mesa;

removing said surrogate first substrate member and one of said plurality of layers to uncover a input light receptor planar backside surface area of said active region, and to expose the backside of said ohmic contact metal; located adjacent said mesa;

forming electrical pads on a portion of said backside of said ohmic contact metal.

2. The method of claim 1 wherein:

said step of growing a plurality of layers includes forming a sacrificial layer on said surrogate first substrate member, forming a first semiconductor layer on said sacrificial layer, forming a second semiconductor layer on said first semiconductor layer; and in said removing step, one of said plurality of layers is said sacrificial layer.

3. The method of claim 2 wherein: said plurality of layers include an n– doped gallium arsenide MESFET active region first layer formed on a sacrificial layer, and an n+ doped gallium arsenide MESFET source-drain region second layer formed on said n– doped gallium arsenide MESFET active region first layer; and said step of growing a plurality of layers includes forming, on said surrogate first substrate member, said sacrificial layer wherein said sacrificial layer is formed of a material from the group consisting of aluminum arsenide and aluminum gallium arsenide.

4. The method of claim 2 wherein said recessed area extends completely through said second semiconductor layer and partially through said first semiconductor layer.

5. The method of claim 1 wherein said first and second semiconductor layers are gallium arsenide layers.

6. The method of claim 1 wherein said surrogate first substrate member is comprised of single crystal gallium arsenide material.

7. The method of claim 6 wherein:

said step of removing said surrogate first substrate member includes removing said surrogate first substrate member down to said sacrificial layer using an etching process from the group consisting of selective chemical reactant etching and reactive ion etching; and said method further includes the step of removing said sacrificial layer with a dilute hydrofluoric acid etch.

8. The method of claim 1 wherein said attaching includes a bonding step from the group consisting of:

bonding said filler layer and said ohmic contact metal located on said crown of said mesa directly to said permanent second substrate member with said adhesive layer, wherein said adhesive layer is thermally-conductive epoxy adhesive;

bonding said filler layer and said ohmic contact metal located on said crown of said mesa directly to said permanent second substrate member with said adhesive layer, wherein said adhesive layer is plasma chemical deposited aluminum nitride material; and bonding said filler layer and said ohmic contact metal located on said crown of said mesa directly to said permanent second substrate member with said adhesive layer, wherein said adhesive layer is plasma chemical deposited diamond.

9. The method of claim 1 wherein said step of forming electrical pads includes attaching bonding metalization to said ohmic contact metal.

10. The method of claim 1 wherein said step of attaching a permanent second substrate member is performed before said step of removing said surrogate first substrate member.

11. The method of claim 1 wherein said step of depositing ohmic contact metal includes depositing a metal alloy consisting of titanium-gold and titanium-platinum-gold.

12. The method of claim 1 wherein said step of depositing ohmic contact metal includes depositing a refractory metal.

13. The method of claim 12 wherein said step of depositing said ohmic contact metal includes depositing a germanium molybdenum tungsten alloy.

14. The method of claim 1 wherein said step of attaching includes bonding said filler layer and said ohmic contact metal located on said crown of said mesa directly to said permanent second substrate member with said adhesive layer, wherein said adhesive layer is a thermally-conductive epoxy adhesive.

15. The method of claim 1 wherein said step of growing a plurality of layers includes forming a 500 Angstroms-thick sacrificial layer on said surrogate first substrate member, forming a 1500 Angstroms-thick first semiconductor layer on said sacrificial layer, and forming a 500 Angstroms-thick second semiconductor layer on said first semiconductor layer.

16. The method of claim 1 wherein said step of forming a Shottky barrier gate electrode includes fabricating said gate electrode from a metal alloy of the group consisting of titanium-gold, and titanium-platinum-gold.

17. The method of claim 1 wherein said step of depositing an ohmic contact metal includes depositing a nickel-gold-germanium alloy metal.

18. The method of claim 1 wherein said step of growing a plurality of layers includes a metal organic chemical vapor deposition (MOCVD) process.

19. The method of fabricating a light sensitive gallium arsenide photo field effect transistor comprising the steps of:

growing three metal semiconductor field effect transistor (MESFET)-related, planar semiconductor layers on a single crystal gallium arsenide surrogate first substrate member, said semiconductor layers include an aluminum arsenide etch stop sacrificial first layer of 500 Angstroms thickness formed on said surrogate first substrate member, an n– gallium arsenide second layer of 1500 Angstroms thickness formed on said stop etch sacrificial first layer, and an n+ gallium arsenide third layer of 500 angstroms thickness formed on said second layer;

forming a mesa on said surrogate first substrate member, wherein said mesa includes said semiconductor layers;

depositing nickel-gold-germanium ohmic contact metal on said mesa and on a portion of said surrogate first substrate member adjacent said mesa;

forming a recessed area in said mesa to form a source, a drain, and a transistor active region, said recessed area extending completely through said third semiconductor layer and partially through said second semiconductor layer to form a depression therein;

forming a metallic Shottky barrier gate electrode within said recessed area on said second semiconductor layer depression and between said source and said drain, wherein said metallic Shottky barrier gate is formed from a material of the group consisting of titanium-gold and titanium-platinum-gold and aluminum;

forming a filler layer over said surrogate first substrate member adjacent said mesa, over the sidewalls of said mesa, and within said recessed area;

forming a heat conductive epoxy adhesive layer on said filler layer and on said ohmic contact metal located on the crown of said mesa;

attaching a permanent second substrate member to said adhesive layer, to said filler layer and to said ohmic contact metal located on said crown of said mesa;

removing said surrogate first substrate member using a lapping and polishing process followed by selective etching sequence, followed by removing said aluminum arsenide etch stop sacrificial first layer, using a dilute hydrofluoric acid etching process, to uncover a input light-receptor planar backside surface area of said active region, and to expose the backside of said ohmic contact metal located adjacent said mesa;

forming electrical pads on a portion of said backside of said ohmic contact metal.

20. The method of claim 19 wherein said aluminum arsenide etch stop sacrificial first layer includes an aluminum concentration of fifty percent;

said n– gallium arsenide second layer comprises a silicon doping of between two and four times ten to the seventeenth power ions per cubic centimeter; and said n+ gallium arsenide third layer comprises a silicon doping of between two and three times ten to the eighteenth power ions per cubic centimeter.

* * * * *